United States Patent
Hayashi et al.

(10) Patent No.: US 10,198,547 B2
(45) Date of Patent: Feb. 5, 2019

(54) SUPPORT APPARATUS, DESIGN SUPPORT METHOD, PROGRAM, AND MEMORY MEDIUM

(71) Applicant: Kabushiki Kaisha Zuken, Yokohama-shi, Kanagawa (JP)

(72) Inventors: Shigeru Hayashi, Yokohama (JP); Naoki Oguni, Yokohama (JP)

(73) Assignee: Kabushiki Kaisha Zuken, Yokohama-shi, Kanagawa (JP)

( * ) Notice: Subject to any disclaimer, the term of this patent is extended or adjusted under 35 U.S.C. 154(b) by 0 days.

(21) Appl. No.: 15/111,530

(22) PCT Filed: Jan. 28, 2014

(86) PCT No.: PCT/JP2014/000427
§ 371 (c)(1),
(2) Date: Jul. 14, 2016

(87) PCT Pub. No.: WO2015/114677
PCT Pub. Date: Aug. 6, 2015

(65) Prior Publication Data
US 2016/0335388 A1    Nov. 17, 2016

(51) Int. Cl.
*G06F 17/50* (2006.01)

(52) U.S. Cl.
CPC ...... *G06F 17/5077* (2013.01); *G06F 17/5068* (2013.01); *G06F 17/5081* (2013.01)

(58) Field of Classification Search
CPC ............. G06F 17/5077; G06F 17/5068; G06F 17/5081
USPC ............................ 716/106, 111, 139; 703/15
See application file for complete search history.

(56) References Cited

U.S. PATENT DOCUMENTS

| | | | | |
|---|---|---|---|---|
| 6,983,434 | B1* | 1/2006 | Frank | G06F 17/5036 716/112 |
| 7,493,578 | B1* | 2/2009 | Milne | G06F 17/5045 703/13 |
| 7,509,615 | B2* | 3/2009 | Hung | H01L 23/49838 257/773 |
| 7,814,445 | B2* | 10/2010 | Iwaki | G06F 17/5036 716/100 |
| 8,296,715 | B2 | 10/2012 | Tsubamoto | |
| 8,839,184 | B1* | 9/2014 | Seguine | G06F 17/5077 716/110 |

(Continued)

FOREIGN PATENT DOCUMENTS

| | | |
|---|---|---|
| JP | 2005-309873 A | 11/2005 |
| JP | 2010-128700 A | 6/2010 |

(Continued)

OTHER PUBLICATIONS

Office Action dated Jun. 19, 2017, in Korean Patent Application No. 10-2016-7019566.

(Continued)

*Primary Examiner* — Phallaka Kik
(74) *Attorney, Agent, or Firm* — Venable LLP (57) ABSTRACT

A design support apparatus for designing a circuit board includes an index indicator configured to obtain an index indicating a degree by which a section of a differential signal line pair, which satisfies a design reference, is occupied in an entire part of the differential signal line pair, and display the index on a display.

25 Claims, 9 Drawing Sheets

(56) References Cited

U.S. PATENT DOCUMENTS

| | | | | |
|---|---|---|---|---|
| 9,965,035 | B2* | 5/2018 | Santamaria | G06F 3/016 |
| 9,971,487 | B2* | 5/2018 | Buzyn | G06F 3/0481 |
| 9,977,855 | B2* | 5/2018 | Kodama | G06F 17/5072 |
| 9,978,110 | B2* | 5/2018 | Vahlberg | G06Q 10/087 |
| 10,003,690 | B2* | 6/2018 | Bouzid | H04M 3/493 |
| 10,018,478 | B2* | 7/2018 | van Os | G10L 21/00 |
| 10,042,511 | B2* | 8/2018 | Roe | G06F 3/04815 |
| 10,051,131 | B2* | 8/2018 | Saylor | H04M 3/493 |
| 10,071,308 | B2* | 9/2018 | Perlman | A63F 13/31 |
| 2004/0239438 | A1* | 12/2004 | Benham | G06F 13/4086 |
| | | | | 333/24 R |
| 2006/0179372 | A1* | 8/2006 | Volk | G06F 13/4072 |
| | | | | 714/724 |
| 2006/0272852 | A1* | 12/2006 | Carrier | G06F 13/4086 |
| | | | | 174/261 |
| 2007/0130555 | A1* | 6/2007 | Osaka | H01L 23/49838 |
| | | | | 439/14 |
| 2008/0082950 | A1* | 4/2008 | Mathews | G06F 17/5068 |
| | | | | 716/50 |
| 2008/0297401 | A1* | 12/2008 | Nishida | G01S 1/10 |
| | | | | 342/147 |
| 2009/0019403 | A1* | 1/2009 | Iwaki | G06F 17/5036 |
| | | | | 716/136 |
| 2009/0157914 | A1* | 6/2009 | Hunkins | G06F 3/14 |
| | | | | 710/30 |
| 2010/0135370 | A1* | 6/2010 | Best | G06F 13/4072 |
| | | | | 375/219 |
| 2011/0163819 | A1* | 7/2011 | Badillo | H03H 11/22 |
| | | | | 331/108 B |
| 2012/0034822 | A1* | 2/2012 | Bopp | H01R 13/6466 |
| | | | | 439/676 |
| 2012/0249188 | A1* | 10/2012 | Nishi | H03K 19/01852 |
| | | | | 327/108 |
| 2012/0274413 | A1* | 11/2012 | Tseng | H03H 7/48 |
| | | | | 333/100 |
| 2013/0159959 | A1* | 6/2013 | Byrne | H04B 3/00 |
| | | | | 716/137 |
| 2013/0298100 | A1* | 11/2013 | Hastings | G06F 17/50 |
| | | | | 716/126 |
| 2014/0026109 | A1* | 1/2014 | Wu | G06F 17/5077 |
| | | | | 716/112 |
| 2015/0331611 | A1* | 11/2015 | Hansen | G06F 3/0608 |
| | | | | 711/103 |

FOREIGN PATENT DOCUMENTS

| | | |
|---|---|---|
| JP | 2013-093056 A | 5/2013 |
| KR | 10-2007-0062174 A | 6/2007 |
| KR | 10-2011-0009634 A | 1/2011 |

OTHER PUBLICATIONS

Chris Laplante et al., "Eagle Matched Length Pairs/Groups", Electrical Engineering Stack Exchange, Feb. 18, 2012, pp. 1-2, XP055381472.

Toradex: Apalis Computer Module Carrier Board Design Guide v1.2, Nov. 26, 2013, pp. 1-27, XP055381463.

European Search Report dated Jul. 31, 2017, in European Patent Application No. 14880659.9.

Office Action dated Jul. 17, 2018, in European Patent Application No. 14880659.9.

Cadsoft Computer: "EAGLE—Easily Applicable Graphical Layout Editor Manual Version 6, 1st Edition", XP055462208 (Aug. 5, 2013).

* cited by examiner

| SIGNAL NAME | TOTAL WIRING LENGTH | COUPLING LENGTH | NON-COUPLING LENGTH | COUPLING RATIO | DIFFERENTIAL IMPEDANCE COMPLIANCE DEGREE | DIFFERENTIAL WIRING RULE COMPLIANCE DEGREE |
|---|---|---|---|---|---|---|
| USB-1 | 250mm | 220mm | 30mm | 88% | 64% | 84% |
| USB-2 | 230mm | 190mm | 40mm | 83% | 60% | 59% |
| USB-3 | 300mm | 275mm | 25mm | 92% | 66% | 67% |

FIG. 5

ATTRIBUTES AND DIFFERENTIAL IMPEDANCES OF SECTIONS OF SIGNAL NAME USB-1

| | COUPLING SECTIONS | | | | | | | | NON-COUPLING SECTIONS | | |
|---|---|---|---|---|---|---|---|---|---|---|---|
| | SECTION 1 | SECTION 2 | SECTION 3 | ... | SECTION 6 | SECTION 7 | SECTION 8 | ... | SECTION A | SECTION B | ... |
| WIRING LENGTH | 30mm | 24mm | 18mm | ... | 32mm | 18mm | 28mm | ... | 7mm | 5mm | ... |
| WIRING WIDTH | 0.08mm | 0.08mm | 0.08mm | ... | 0.12mm | 0.08mm | 0.08mm | ... | 0.08mm | 0.08mm | ... |
| INTERVAL BETWEEN SIGNAL LINES | 0.1mm | 0.1mm | 0.08mm | ... | 0.06mm | 0.1mm | 0.1mm | ... | × | × | × |
| LAYER | 2ND LAYER | 8TH LAYER | 8TH LAYER | ... | 2ND LAYER | 2ND LAYER | 2ND LAYER | ... | 2ND LAYER | 8TH LAYER | × |
| DIFFERENTIAL IMPEDANCE | 80Ω | 87Ω | 87Ω | ... | 80Ω | 90Ω | 99Ω | ... | × | × | × |

LOWER LIMIT OF DIFFERENTIAL IMPEDANCE: 83 Ω

UPPER LIMIT OF DIFFERENTIAL IMPEDANCE: 97 Ω

FIG. 9

SUPPORT APPARATUS, DESIGN SUPPORT METHOD, PROGRAM, AND MEMORY MEDIUM

CROSS-REFERENCE TO RELATED APPLICATIONS

This application is a national phase of PCT/JP2014/000425, filed on Jan. 28, 2014.

TECHNICAL FIELD

The present invention relates to a design support apparatus, a design support method, a program, and a memory medium.

BACKGROUND ART

A differential interface is known as an interface which is hardly affected by noise. A differential signal line pair for transmitting a differential signal is used between semiconductor chips each having a differential interface. In design of a differential signal line pair in a circuit board (printed circuit board), various restrictions must be satisfied to obtain sufficient noise resistance.

PTL 1 describes a board, design program having an error check function of checking an error portion in which a differential impedance falls outside a reference range in the wiring pattern of a differential pair line (differential signal line pair).

CITATION LIST

Patent Literature

PTL 1: Japanese Patent Laid-open No. 2013-93056

SUMMARY OF INVENTION

Technical Problem

In design of a differential signal line pair in a circuit board, it is insufficient to determine a design reference to be satisfied and evaluate the design by determining whether the design satisfies the design reference. In the design of the differential signal line pair, there may be sections such as a section in which wiring widths of two signal lines constituting a differential signal line pair must be changed, a section in which an interval between the two signal lines must be changed, and a section in which the two signal lines cannot be arranged parallel to each other, which deviate from the ideal design. Generation of a small number of such sections is allowed, but generation of an excessive number of such sections cannot be allowed from the viewpoint of signal transmission quality.

There is no conventional design support apparatus which presents, to a designer, a degree by which design of a differential signal line pair satisfies a design reference. A designer must perform design depending on his experience and intuition. Design results may vary depending on designers.

It is an object of the present invention to provide a technique advantageous in design support for a differential signal line pair.

Solution to Problem

According to the first aspect of the present invention, there is provided a design support apparatus for designing a circuit board, comprising an index indicator configured to obtain an index indicating a degree by which a section of a differential signal line pair, which satisfies a design reference, is occupied in an entire part of the differential signal line pair, and display the index on a display.

According to the second aspect of the present invention, there is provided a design support method for designing a circuit board, comprising an index indication step of obtaining an index indicating a degree by which a section of a differential signal line pair, which satisfies a design reference, is occupied in an entire part of the differential signal line pair, and displaying the index on a display.

According to the third aspect of the present invention, there is provided a program for operating a computer so as to constitute a design support apparatus according to the first aspect.

According to the fourth aspect of the present invention, there is provided a memory medium storing a program for operating a computer so as to constitute a design support apparatus according to the first aspect.

Advantageous Effects of Invention

The present invention provides a technique advantageous in design support of a differential signal line pair.

DESCRIPTION OF EMBODIMENTS

The present invention will be described using an exemplary embodiment with reference to the accompanying drawings.

Figure 1:
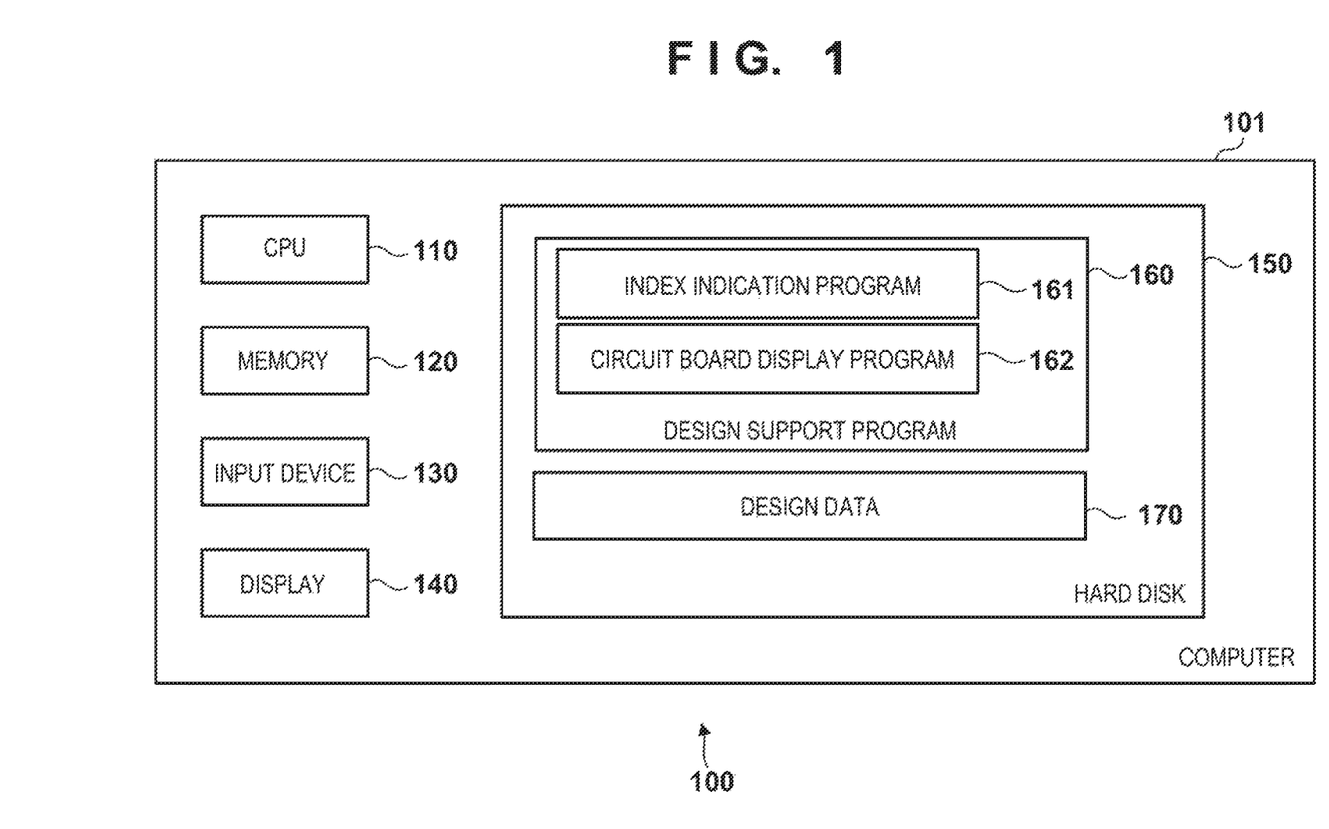
FIG. 1 is a block diagram showing the arrangement of a design support apparatus according to an embodiment of the present invention.

FIG. 1 shows the arrangement of a design support apparatus 100 according to an embodiment of the present invention. The design support apparatus 100 is formed by installing a design support program 160 in a computer 101. The design support apparatus 100 or computer 101 includes a CPU 110, a memory 120, an input device (for example, a keyboard, a touch panel, and a mouse) 130, a display 140, and a hard disk (memory) 150. The design support program 160 can be installed in the hard disk 150. The design support program 160 can be distributed in the form of a memory medium storing this program. The hard disk 150 can store design data 170 generated by executing the design support program 160.

The design support program 160 can include an index indication program 161. Execution of the index indication program 161 allows the computer 101 to serve as the design support apparatus 100 including the index indicator. The design support program 160 can include a circuit board display program 162. Execution of the circuit board, display program 162 allows the computer 101 to serve as the design support apparatus 100 including a circuit board display unit.

Figure 2:
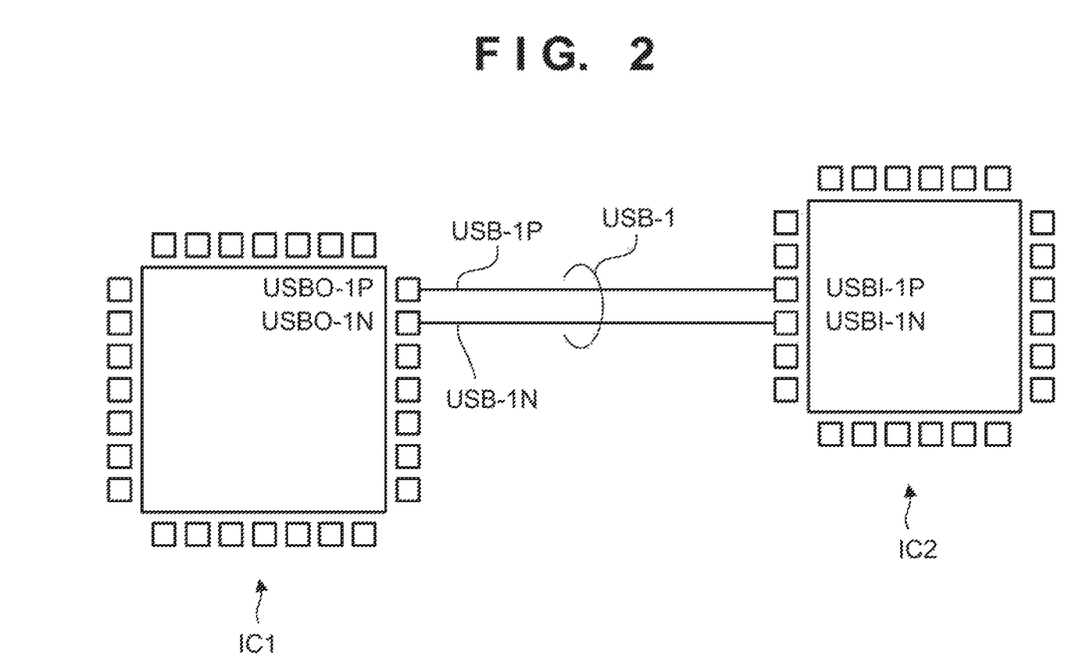
FIG. 2 is a view showing a design example.

A design support method executed by the design support apparatus 100 will be exemplarily explained with reference to FIGS. 1 to 8. As shown in FIG. 2, assume here that pins SUBO-1P and SUBO-1N of a semiconductor chip IC1 are connected to pins USBI-1P and USBI-1N via a differential signal line pair USB-1. The differential signal line pair USB-1 is constituted by two signal lines USB-1P and USB-1N to which signals of opposite phases are applied.

Figure 3:
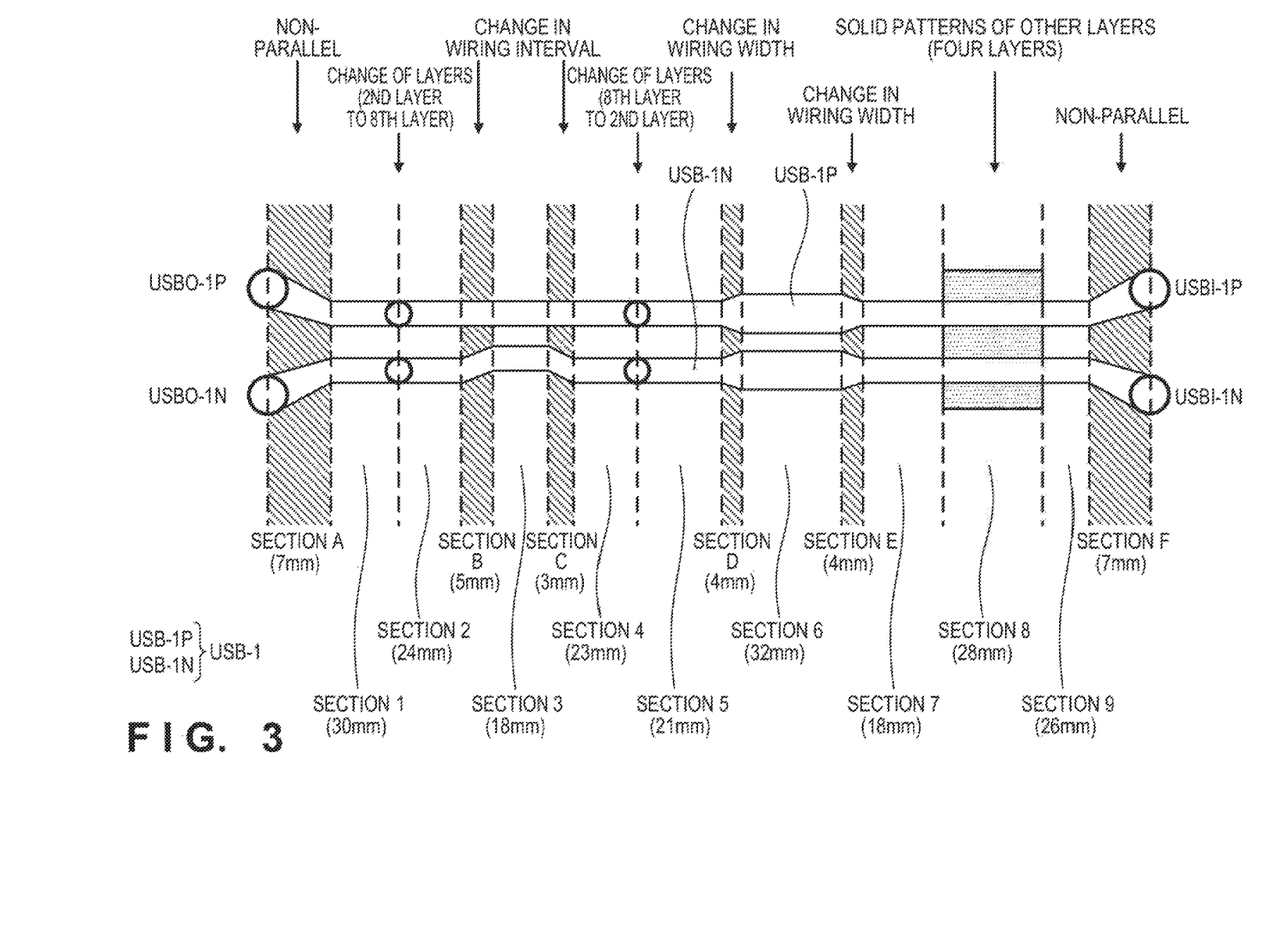
FIG. 3 is a schematic view showing a design example of a differential signal line pair wiring pattern generated by the design support apparatus.

FIG. 3 schematically shows an example of a wiring pattern of the differential signal line pair USB-1 (USB-1P and USB-1N) generated by the design support apparatus 100 (the design support program 160). The wiring pattern of the differential signal line pair USB-1 can be generated by an instruction supplied via the input device 130 from a designer who operates the design support apparatus 100, an automatic wiring function incorporated in the design support program 160, or both the instruction and the automatic wiring function.

Figure 8:
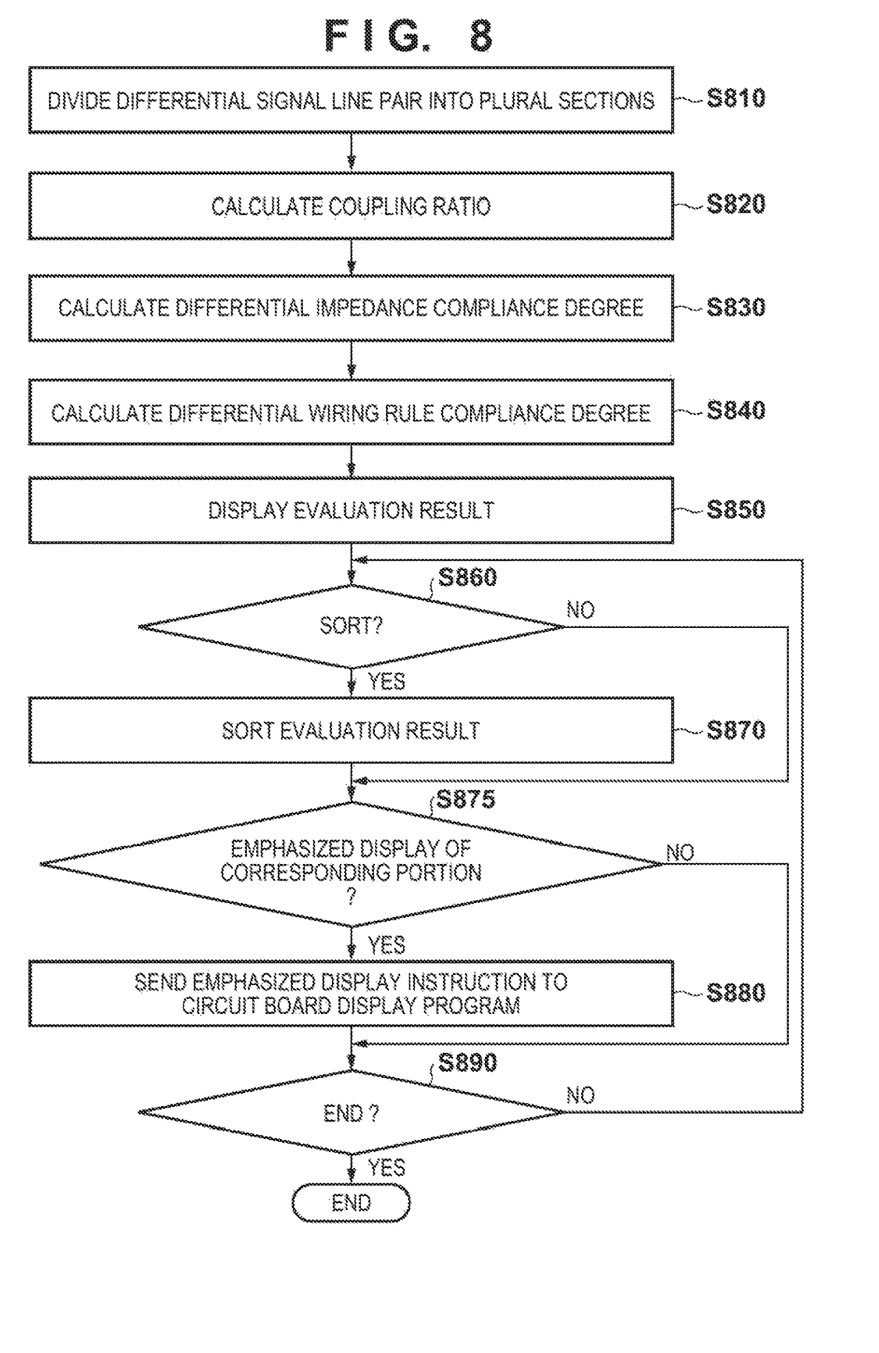
FIG. 8 is a flowchart showing the sequence of processing by an index indication program.

FIG. 8 is a flowchart showing the sequence of processing by the index indication program 161 incorporated in the design support program 160 (or by the index indicator constituted by the program 161). In step S810, the index indication program 161 divides the differential signal line pair into a plurality of sections. For example, in the example shown in FIG. 3, the wiring pattern of the differential signal line pair USB-1 is divided into sections 1 to 9 and sections A to F.

The differential signal line pair is divided by the index indication program 161, for example, at the following positions where the wiring pattern features of the two signal lines constituting the differential signal line pair change.

A position where the wiring patterns of two signal lines change from a non-parallel state to a parallel state A position where the wiring patterns of two signal lines change from a parallel state to a non-parallel state A position where a layer in which at least one of the wiring patterns of two signal lines is arranged (a via position)

A start or end position of an interval where the widths of the wiring patterns of two signal lines change A start or end position of an interval where the interval between the wiring patterns of two signal lines changes A start or end position of a section where a wiring pattern crosses a solid, pattern (a pattern having an area of a predetermined value or more) arranged in another layer In step S820, the index indication program 161 calculates a coupling ratio by evaluating a plurality of sections divided in step S810. In FIG. 3, sections 1 to 9 are sections where the wiring pattern of the differential signal line pair USB-1 satisfies a coupling condition serving as an example of the design reference while sections A to F are sections where the wiring pattern of the differential signal line pair USB-1 does not satisfy the coupling condition. The coupling condition includes, for example, a reference (to be referred to as reference 1 hereinafter) representing that two signal lines constituting a differential signal line pair should be arranged in the same layer, a reference (to be referred to as reference 2 hereinafter) representing that the two signal lines should be arranged parallel to each other, and a reference interval (to be referred to as reference 3 hereinafter) between the two signal lines. In sections A to F, the wiring patterns of the two signal lines USB-1P and USB-1N are not parallel to each other and do not satisfy reference 2. Note that references 1, 2, and 3 are merely examples, and can be changed, as needed.

The coupling ratio is an index indicating a degree by which a section of the differential signal line pair, which satisfies the coupling condition serving as one of the design references, is occupied in the entire differential signal line pair. More specifically, the degree can be a ratio of the section of the differential signal line pair, which satisfy the coupling condition serving as one of the design references, to the entire differential signal line pair.

The coupling ratio can be calculated by, for example, the following equation.

(coupling ratio)=(total wiring length of sections of two signal lines of differential signal line pair, which satisfy coupling condition)/(total wiring length of two signal lines of differential signal line pair)

In the example shown in FIG. 3, as described above, sections 1 to 9 are sections where the wiring pattern of the differential signal line pair USB-1 satisfies the coupling condition, while sections A to F are sections where the wiring pattern of the differential signal line pair USB-1 does not satisfy the coupling condition. The "total wiring length of the section of the two signal lines of the differential signal line pair, which satisfies the coupling condition" is the total wiring length of sections 1 to 9 of the two signal lines USB-1P and USB-1N of the differential signal line pair USB-1. The "total wiring length of the two signal lines of the differential signal line pair" is the total wiring length of sections 1 to 9 and sections A to F.

Figure 9:
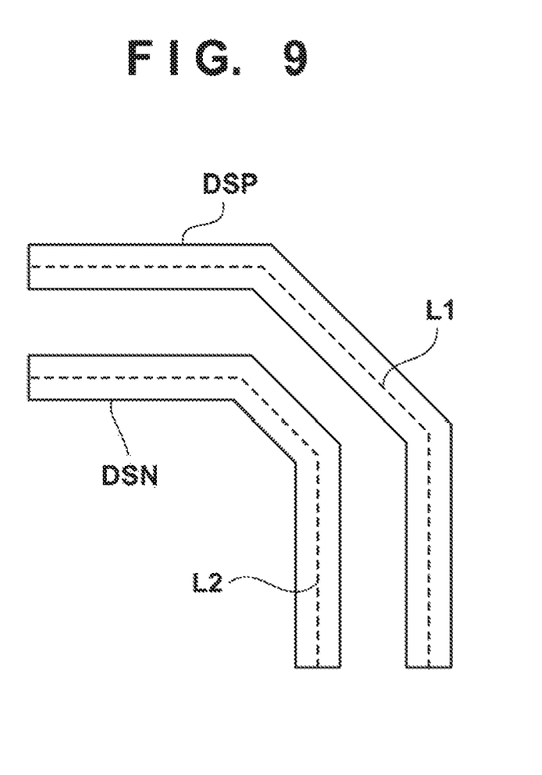
FIG. 9 is a view showing an example of the wiring patterns of two signal lines constituting a differential signal line pair.

In an example, the "total wiring length of the sections of the two signal lines of the differential signal line pair, which satisfy the coupling condition" can be defined as the sum of the wiring length of sections of at least one of the two signal lines, which satisfy the coupling condition, and the wiring length of the sections of the other of the two signal lines. The "total wiring length of the two signal lines of the differential signal line pair" can be defined as the sum of the wiring length of one of the two signal lines and the wiring length of the other of the two signal lines. It is convenient to handle these definitions such that the lengths of the two signal lines of the differential signal line pair are different from each other. For example, as shown in FIG. 9, if the lengths of the wiring patterns of two signal lines DSP and DSN of the differential signal line pair are defined as lengths L1 and L2 of the center lines of the wiring patterns, L1 and L2 are different from each other.

In step S830, the index indication program 161 obtains a differential impedance compliance degree of the two signal lines of the differential signal line pair by evaluating the plurality of sections divided in step S810. The differential impedance compliance degree is an index indicating the degree by which the section satisfying the "differential impedance reference range" of the differential signal line pair is occupied in the entire differential signal line pair. More specifically, for example, the degree can be a ratio of the section of the differential signal line pair, which satisfies the "differential impedance reference range" serving as one of the design references to the entire differential signal line pair. This reference range can be given as minimum and maximum values.

The differential impedance compliance degree can be calculated by, for example, the following equation.

(differential impedance compliance degree)=(total wiring length of sections of two signal lines of differential signal line pair, which satisfy reference range)/(total wiring length of two signal lines of differential signal line pair)

Here, the differential impedance can be calculated in consideration of a solid pattern which receives a fixed, potential such as a power supply potential or ground potential and is arranged in a layer different from a layer in which the differential signal line pair is arranged. As an example, the "total wiring length of the sections of the two signal lines of the differential signal line pair, which satisfy the reference range" can be defined as the sum of the total wiring length of the sections of one of the two signal lines, which satisfy the reference range of the differential impedance and the total wiring length of the sections of the other of the two signal lines, which satisfy the reference range of the differential impedance.

In step S840, the index indication program 161 obtains a differential wiring rule compliance degree of the differential signal line pair by evaluating the plurality of sections divided in step S810. The differential wiring rule compliance degree is an index indicating a degree by which a section of the differential signal line pair, which satisfies a differential wiring rule serving as one of the design references, is occupied in the entire differential signal line pair. More specifically, for example, the degree can be a ratio of the section of the differential signal line pair, which satisfies the differential wiring rule serving as one of the design references, to the entire differential signal line pair.

The differential wiring rule includes, for example, a reference (to be referred to as reference 4 hereinafter) representing that two signal lines of the differential signal line pair are arranged in the same layer, a reference width (to be referred to as reference 5 hereinafter) of each of the two signal lines determined for each layer, and a reference interval (to foe referred to as reference 6) between the two signal lines determined for each layer.

The differential wiring rule compliance degree can be calculated by the following equation.

(differential wiring rule compliance degree)=(total wiring length of sections of two signal lines of differential signal line pair, which satisfy differential wiring rule)/(total wiring length of two signal lines of differential signal line pair)

As an example, the "total wiring length of the sections of the two signal lines of the differential signal line pair, which satisfy the differential wiring rule" can be defined as the sum of the total wiring length of the sections of one of the two signal lines of the differential signal line pair, which satisfy the differential wiring rule and the total wiring length of the sections of the other of the two signal lines, which satisfy the differential wiring rule.

Figure 4:
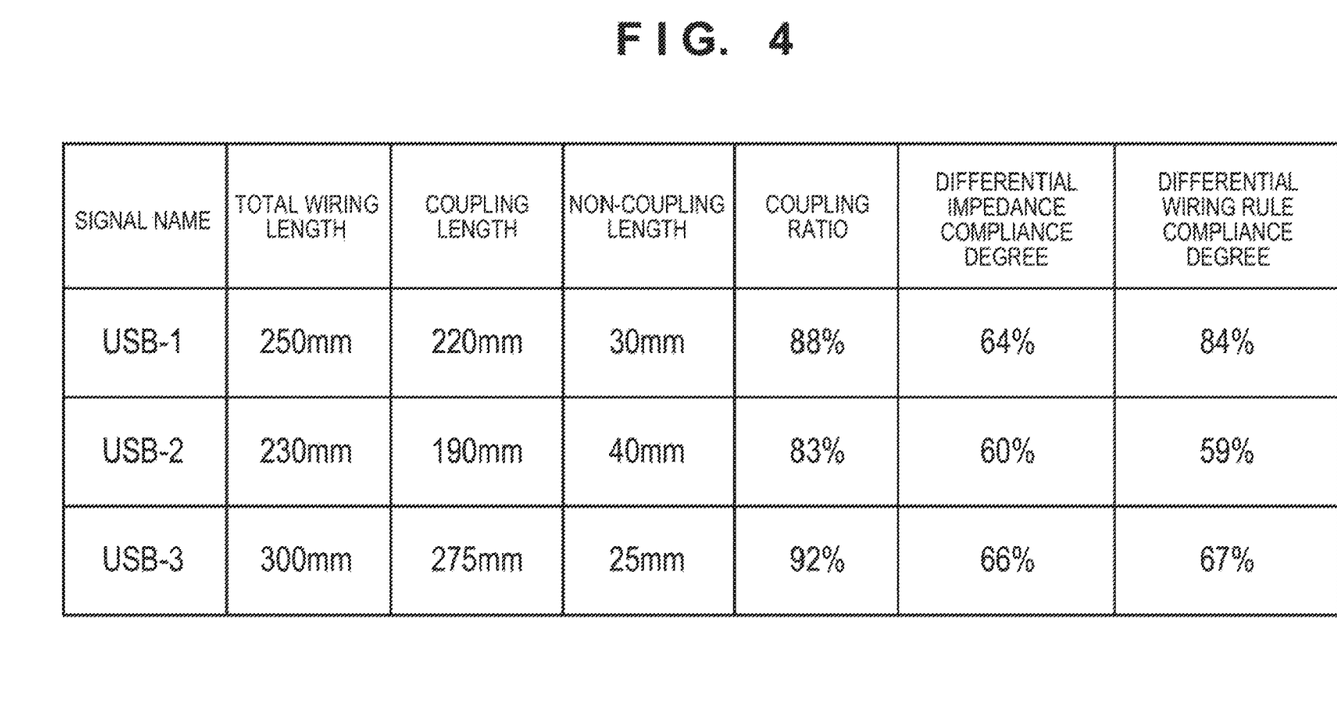
FIG. 4 is a table showing the evaluation result of the wiring pattern of the differential signal line pair.

In step S850, the index indication program 161 displays, on the display 140 as evaluation results, the coupling ratio, the differential impedance compliance degree, and the differential wiring rule compliance degree respectively obtained, in steps S820, S830, and S840. FIG. 4 exemplarily shows the evaluation result displayed on the display 140 in step S850. The evaluation result includes evaluation results for a plurality of differential signal line pairs. The "signal name" is a name of a differential signal line pair. The "total wiring length" is, for example, the sum of the wiring length of one of the two signal lines of the differential signal line pair and the wiring length of the other of the two signal lines. The "coupling length" is, for example, the sum of the wiring length of the section of one of the two signal lines of the differential signal line pair, which satisfies the coupling condition, and the wiring length of the section of the other of the two signal lines, which satisfies the coupling condition. The "coupling ratio", the "differential impedance compliance degree", and the "differential wiring rule compliance degree" can comply with the above-mentioned definitions.

As described above, the designer performs the design depending on an index by displaying, on the display, the index indicating a degree by which the section of the differential signal line pair, which satisfies the design reference, is occupied in the entire differential signal line pair. Design variations by designers can be reduced accordingly.

Figure 5:
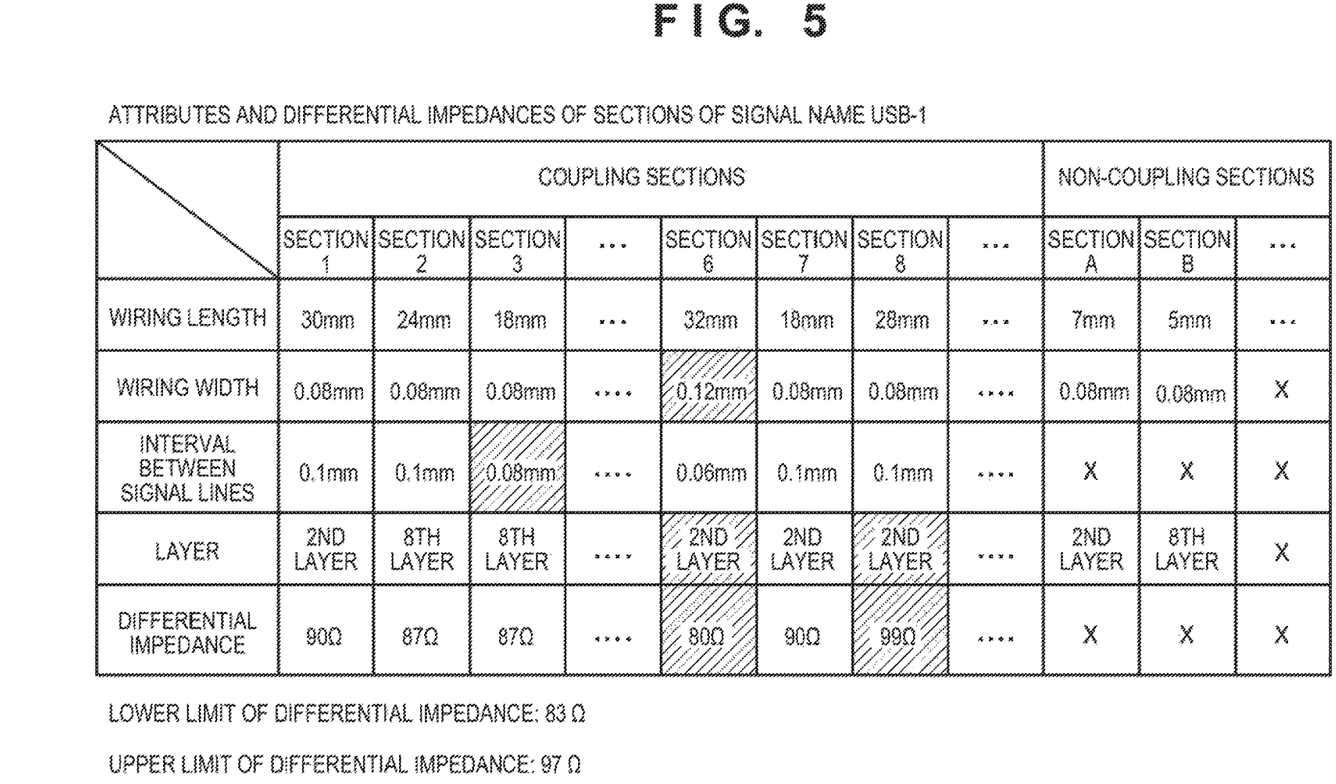
FIG. 5 is a table showing the evaluation result of the wiring pattern of the differential signal line pair.

FIG. 5 shows the display example of the attributes (wiring length, wiring width, and interval of signal lines) and differential impedance of each section of the differential signal line pair USB-1 divided in step S810. For example, the operation of the input device 130 allows selection of a signal name in the evaluation result of FIG. 4. Therefore, the detailed evaluation results shown in FIG. 5 can be displayed on the display 140.

In the example shown in FIG. 5, sections 1, 2, and 3 and the like indicated as the "coupling sections" are sections satisfying the coupling condition. Sections A and B and the like indicated as the "non-coupling sections" are sections not satisfying the coupling condition. That is, FIG. 5 shows the sections satisfying the coupling condition and the sections not satisfying the coupling condition. In other words, the display 140 displays pieces of information indicating whether the plurality of sections satisfy the coupling condition serving as the design reference.

In the example shown in FIG. 5, the differential impedance of section 6 of the differential signal line pair USB-1 in FIG. 1 is 80Ω which is lower than the set lower limit value (83Ω. The differential impedance of section 8 of the differential signal line pair USB-1 is 99Ω, which is higher than the set upper limit value (97Ω). That is, sections 6 and 8 of the differential signal line pair USB-1 are sections not satisfying the differential impedance reference range. In this case, sections 6 and 8 not satisfying the differential impedance reference range are displayed by distinguishing them from other sections. That is, FIG. 5 shows the sections satisfying the differential impedance reference range and the sections not satisfying this range. In other words, the display 140 displays pieces of information indicating whether the plurality of sections satisfy the reference impedance reference range serving as the design reference. In this example, the "total wiring length of the sections of the two signal lines of the differential signal line pair, which satisfy the reference impedance reference range" is the sum of wiring lengths of sections 1, 2, 3, 4, 5, 7, and 9. In this example, the differential impedances of the "non-coupling sections" are not shown. When the wiring width changes in a section like section A, a representative line width such as a minimum wiring width can be displayed.

In the example shown in FIG. 5, the interval between the two signal lines USB-1P and USB-1N of section 3 of the differential signal line pair USB-1 is 0.08 mm which is smaller than the reference interval (not shown). Also the width of each of the two signal lines USB-IP and USB-IN of section 6 of the differential signal line pair USBS-1 is 0.12 mm which is larger than the reference width (not shown). Sections 3 and 6 of the differential signal line pair USB-1 are sections not satisfying the differential wiring rule. Sections 3 and 6 not satisfying the differential, wiring rule are displayed by distinguishing them from other sections. That is, FIG. 5 shows the sections satisfying the differential wiring rule and the sections not satisfying this rule. In other words, the display 140 displays pieces of information indicating whether the plurality of sections satisfy the differential wiring rule. In this example, the "total wiring length of the sections in which the differential signal line pair satisfies the differential wiring rule" is the sum of the wiring lengths of sections 1, 2, 4, 5, 7, 8, and 9.

The index indication program 161 can include a function of sorting pieces of information including indices of the plurality of differential signal line pairs displayed on the display 140. When the index indication program 161 receives a sort instruction from the designer via the input device 130 in step S860, the index indication program 161 sorts the pieces of information including indices of the plurality of differential signal line pairs displayed on the display 140 in step S870. For example, the designer can sort the evaluation results exemplified in FIG. 4, based on one of the coupling ratio, the differential impedance, and the differential wiring rule compliance degree.

The index indication program 161 can have a function of causing the circuit board display program 162 to select at least one, or all of the plurality of differential, signal line pairs and perform emphasized display of the wiring patterns corresponding to the circuit boards. The index indication program 161 can also have a function of causing the circuit board display program 162 to select an arbitrary section of a selected differential signal line pair and perform emphasized display of a section corresponding to the circuit board. When the index indication program 161 receives an emphasized display instruction from the designer via the input device 130 in step S875, the index indication program 161 causes the circuit board display program 162 to perform the emphasized display of the corresponding differential signal line pair or section in accordance with the above instruction in step S880.

For example, the designer can perform emphasized display of the differential signal line pair having an arbitrary signal name on the display 140 by selecting this signal name in the evaluation result exemplified in FIG. 4. More specifically, when the designer selects an arbitrary signal name in the table exemplified in FIG. 4, the index indication program 161 transfers this signal name to the circuit board display program 162. In response to this, the circuit board display program 162 performs emphasized display of the differential signal line pair having this signal name.

Figure 6:
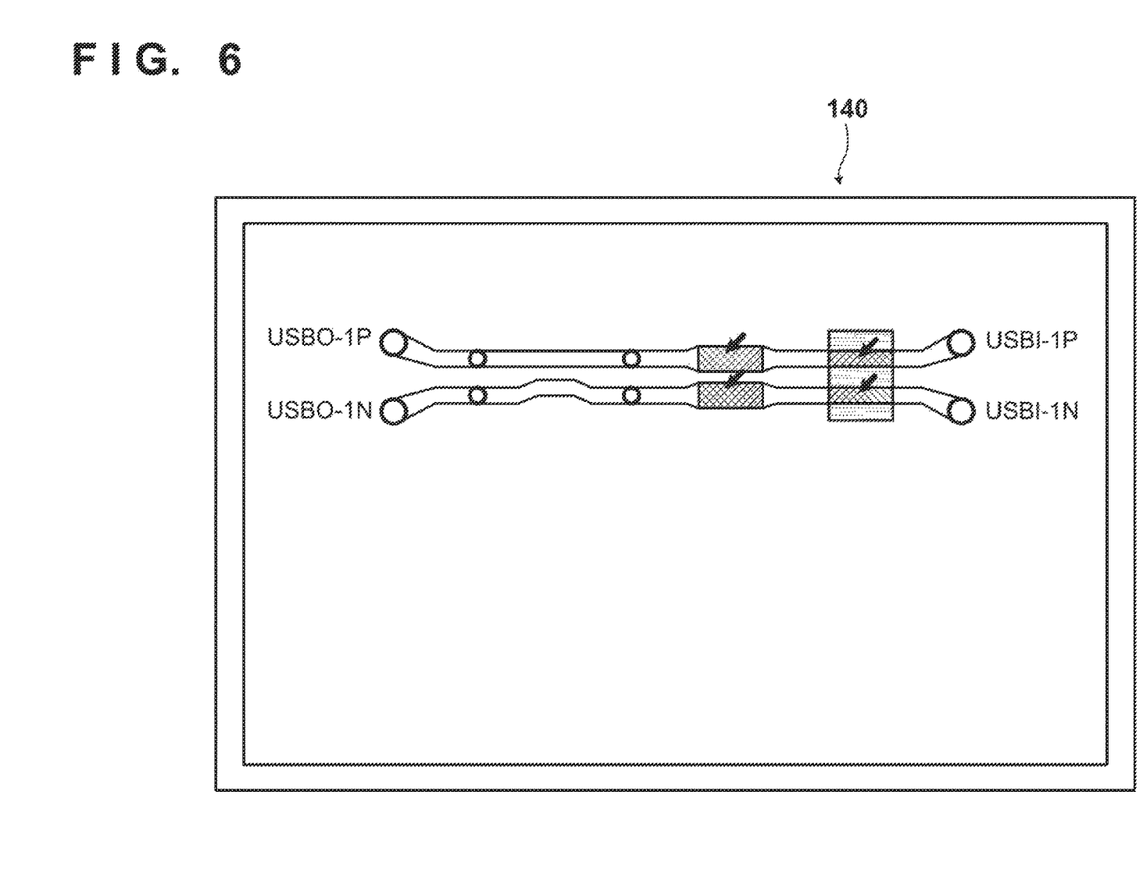
FIG. 6 is a view showing an example of emphasized display of sections constituting a differential signal line pair.
Figure 7:
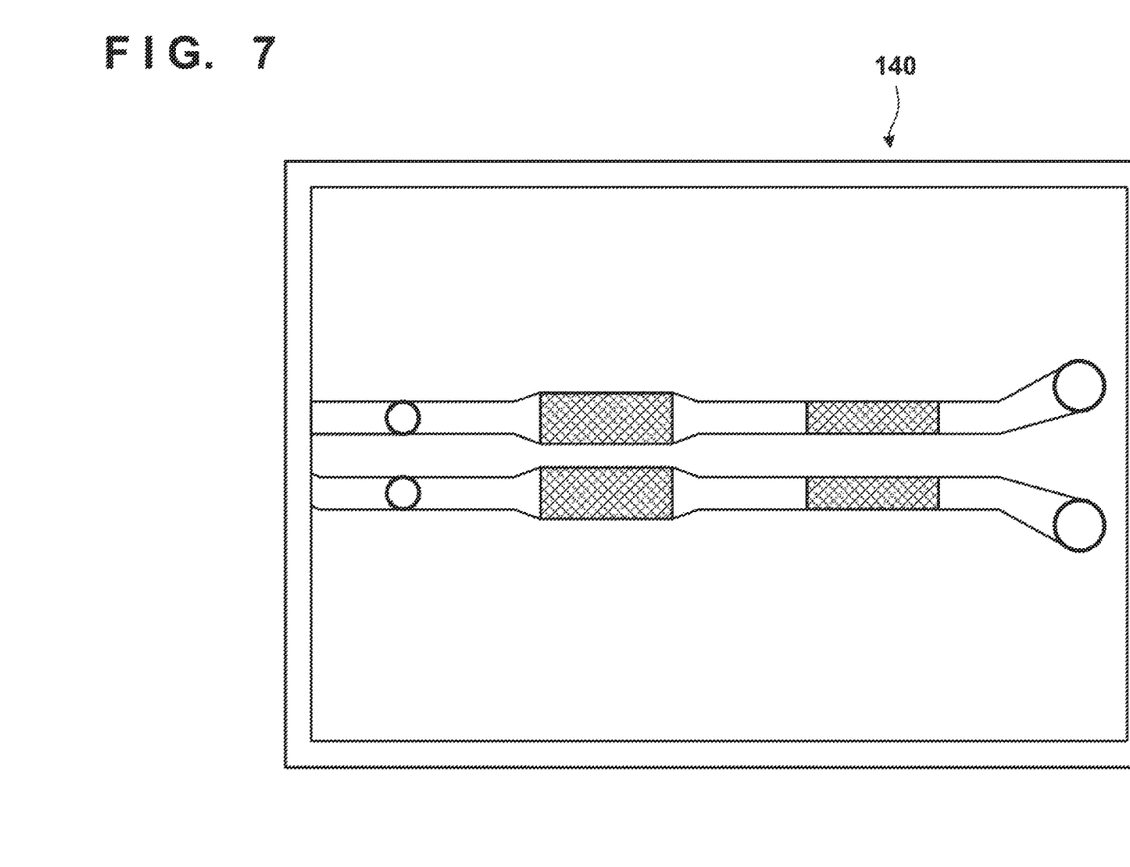
FIG. 7 is a view showing the example of the emphasized display of the sections constituting the differential signal line pair.

In addition, when the designer selects an arbitrary item in the table exemplified in FIG. 5, the display 140 can perform emphasized display of the section corresponding to the selected item in the entire wiring pattern of the differential signal line pair. More specifically, when the designer selects an arbitrary item in the table exemplified in FIG. 5, the index indication program 161 transfers information for identifying the section corresponding to this item to the circuit board display program 162. In response to this, the circuit board display program 162 performs emphasized display of the section corresponding to this information. FIGS. 6 and 7 schematically show a state in which when an item (for example, "80 Ω and 99Ω" as the "differential impedances" of sections 6 and 8) corresponding to sections 6 and 8 is selected, the circuit board display program 162 performs emphasized display of sections of the differential signal line pair SUB-1 which correspond to sections 6 and 8.

According to this emphasized display function, the designer can immediately find a differential signal line pair or section to be corrected.

The invention claimed is:

1. A design support apparatus for designing a circuit board, the apparatus comprising:
an index indicator operating on a computer and configured to:
calculate, for each of a plurality of differential signal line pairs each constituted by a pair of wiring patterns, an index indicating a ratio of a section of a differential signal line pair, which section satisfies a design reference, to the entirety of the differential signal line pair, wherein in calculating the index for each of the plurality of differential signal line pairs, the index indicator divides each differential signal line pair into a plurality of sections at each position where a feature of the pair of wiring patterns of the differential signal line pair changes, and evaluates whether or not each of the plurality of sections satisfies the design reference,
control a display to display, for each of the plurality of differential signal line pairs, the index,
receive, from a designer via an input device, an instruction designating a selection of a section of a differential signal line pair, and
control the display to display the circuit board in which the selected section is emphasized.

2. The design support apparatus according to claim 1, wherein the index indicator includes a function of sorting pieces of information including the indices of the plurality of differential signal line pairs displayed on the display.

3. The design support apparatus according to claim 1, wherein the index indicator is configured to:
receive, from a designer via an input device, an instruction designating a selection of a differential signal line pair among the plurality of differential signal line pairs, and
control the display to display the circuit board in which the selected differential signal line pair is emphasized.

4. The design support apparatus according to claim 1, wherein the ratio is a ratio of a total wiring length of a section of two signal lines of the differential signal line pair, which satisfies the design reference, to a total wiring length of the two signal lines.

5. The design support apparatus according to claim 4, wherein
the total wiring length of the section of the two signal lines, which satisfies the design reference is a sum of a wiring length of the section of one of the two signal lines and a wiring length of the section in the other of the two signal lines, and
the total wiring length of the two signal lines is a sum of the one of the two signal lines and the other of the two signal lines.

6. The design support apparatus according to claim 1, wherein the design reference includes a reference representing that two signal lines of the differential signal line pair should be arranged in the same layer, a reference representing that the two signal lines should be arranged parallel to each other, and a reference interval between the two signal lines.

7. The design support apparatus according to claim 1, wherein the design reference includes a reference range of differential impedances of two signal lines of the differential signal line pair.

8. The design support apparatus according to claim 1, wherein the design reference includes a reference representing that two signal lines of the differential signal line pair should be arranged in the same layer, reference widths of two signal lines determined for each layer, and a reference interval between two signal lines determined for each layer.

9. The design support apparatus according to claim 1, wherein the position includes:
a position where the pair of wiring patterns changes from a non-parallel state to a parallel state,
a position where the pair of wiring patterns changes from a parallel state to a non-parallel state,
a position of a via for each of the pair of wiring patterns,
a start or end position of an interval where the width of the pair of wiring patterns changes,
a start or end position of an interval where the interval between the pair of wiring patterns changes, and/or
a start or end position of a section where each of the pair of wiring patterns crosses a solid pattern.

10. A design support method operating on a computer for designing a circuit board, the method comprising:
calculating, for each of a plurality of differential signal line pairs each constituted by a pair of wiring patterns, an index indicating a ratio of a section of a differential signal line pair, which section satisfies a design reference, to the entirety of the differential signal line pair, wherein in calculating the index for each of the plurality of differential signal line pairs, the index indicator divides each differential signal line pair into a plurality of sections at each position where a feature of the pair of wiring patterns of the differential signal line pair changes, and evaluates whether or not each of the plurality of sections satisfies the design reference;
controlling a display to display, for each of the plurality of differential signal line pairs, the index;
receiving, from a designer via an input device, an instruction designating a selection of a section of a differential signal line pair; and
controlling the display to display the circuit board in which the selected section is emphasized.

11. The design support method according to claim 10, wherein the position includes:
a position where the pair of wiring patterns changes from a non-parallel state to a parallel state,
a position where the pair of wiring patterns changes from a parallel state to a non-parallel state,
a position of a via for each of the pair of wiring patterns,
a start or end position of an interval where the width of the pair of wiring patterns changes,
a start or end position of an interval where the interval between the pair of wiring patterns changes, and/or
a start or end position of a section where each of the pair of wiring patterns crosses a solid pattern.

12. A non-transitory computer-readable medium storing a program for operating a computer so as to function as a design support apparatus comprising:
an index indicator operating on a computer and configured to:
calculate, for each of a plurality of differential signal line pairs each constituted by a pair of wiring patterns, an index indicating a ratio of a section of a differential signal line pair, which section satisfies a design reference, to the entirety of the differential signal line pair, wherein in calculating the index for each of the plurality of differential signal line pairs, the index indicator divides each differential signal line pair into a plurality of sections at each position where a feature of the pair of wiring patterns of the differential signal line pair changes, and evaluates whether or not each of the plurality of sections satisfies the design reference,
control a display to display, for each of the plurality of differential signal line pairs, the index,
receive, from a designer via an input device, an instruction designating a selection of a section of a differential signal line pair, and
control the display to display the circuit board in which the selected section is emphasized.

13. The non-transitory computer-readable medium according to claim 12, wherein the position includes:
a position where the pair of wiring patterns changes from a non-parallel state to a parallel state,
a position where the pair of wiring patterns changes from a parallel state to a non-parallel state,
a position of a via for each of the pair of wiring patterns,
a start or end position of an interval where the width of the pair of wiring patterns changes,
a start or end position of an interval where the interval between the pair of wiring patterns changes, and/or
a start or end position of a section where each of the pair of wiring patterns crosses a solid pattern.

14. A design support apparatus for designing a circuit board, the apparatus comprising:
an index indicator operating on a computer and configured to:
calculate, for each of a plurality of differential signal line pairs each constituted by a pair of wiring patterns, an index indicating a ratio of a section of a differential signal line pair, which section satisfies a design reference, to the entirety of the differential signal line pair, wherein in calculating the index for each of the plurality of differential signal line pairs, the index indicator divides each differential signal line pair into a plurality of sections at each position where a feature of the pair of wiring patterns of the differential signal line pair changes, and evaluates whether or not each of the plurality of sections satisfies the design reference,
control a display to display a first table showing the indices respectively calculated for each of the plurality of differential signal line pairs, the index with signal names thereof,
receive, from a designer via an input device, an instruction selecting, in the first table, a differential signal line pair among the plurality of differential signal line pairs,
control the display to display a second table showing results respectively evaluated for the plurality of sections of the selected differential signal line pair,
receive, from the designer via the input device, an instruction designating a selection of selecting, in the second table, a section among the plurality of sections of the selected differential signal line pair, and
control the display to display the circuit board in which the selected section is emphasized.

15. The design support apparatus according to claim 14, wherein the index indicator includes a function of sorting pieces of information including the indices of the plurality of differential signal line pairs displayed on the display.

16. The design support apparatus according to claim 14, wherein the ratio is a ratio of a total wiring length of a section of two signal lines of the differential signal line pair, which satisfies the design reference, to a total wiring length of the two signal lines.

17. The design support apparatus according to claim 16, wherein
the total wiring length of the section of the two signal lines, which satisfies the design reference is a sum of a wiring length of the section of one of the two signal lines and a wiring length of the section in the other of the two signal lines, and the total wiring length of the two signal lines is a sum of the one of the two signal lines and the other of the two signal lines.

18. The design support apparatus according to claim 14, wherein the design reference includes a reference representing that two signal lines of the differential signal line pair should be arranged in the same layer, a reference representing that the two signal lines should be arranged parallel to each other, and a reference interval between the two signal lines.

19. The design support apparatus according to claim 14, wherein the design reference includes a reference range of differential impedances of two signal lines of the differential signal line pair.

20. The design support apparatus according to claim 14, wherein the design reference includes a reference representing that two signal lines of the differential signal line pair should be arranged in the same layer, reference widths of two signal lines determined for each layer, and a reference interval between two signal lines determined for each layer.

21. The design support apparatus according to claim 14, wherein the position includes:
a position where the pair of wiring patterns changes from a non-parallel state to a parallel state,
a position where the pair of wiring patterns changes from a parallel state to a non-parallel state,
a position of a via for each of the pair of wiring patterns,
a start or end position of an interval where the width of the pair of wiring patterns changes,
a start or end position of an interval where the interval between the pair of wiring patterns changes, and/or
a start or end position of a section where each of the pair of wiring patterns crosses a solid pattern.

22. A design support method operating on a computer for designing a circuit board, the method comprising:
calculating, for each of a plurality of differential signal line pairs each constituted by a pair of wiring patterns, an index indicating a ratio of a section of a differential signal line pair, which section satisfies a design reference, to the entirety of the differential signal line pair, wherein in calculating the index for each of the plurality of differential signal line pairs, the index indicator divides each differential signal line pair into a plurality of sections at each position where a feature of the pair of wiring patterns of the differential signal line pair changes, and evaluates whether or not each of the plurality of sections satisfies the design reference;
controlling a display to display a first table showing the indices respectively calculated for the plurality of differential signal line pairs, with signal names thereof;
receiving, from a designer via an input device, an instruction selecting, in the first table, a differential signal line pair among the plurality of differential signal line pairs,
controlling the display to display a second table showing results respectively evaluated for the plurality of sections of the selected differential signal line pair;
receiving, from the designer via the input device, an instruction selecting, in the second table, a section among the plurality of sections of the selected differential signal line pair; and controlling the display to display the circuit board in which the selected section is emphasized.

23. The design support method according to claim 22, wherein the position includes:
a position where the pair of wiring patterns changes from a non-parallel state to a parallel state,
a position where the pair of wiring patterns changes from a parallel state to a non-parallel state,
a position of a via for each of the pair of wiring patterns,
a start or end position of an interval where the width of the pair of wiring patterns changes,
a start or end position of an interval where the interval between the pair of wiring patterns changes, and/or
a start or end position of a section where each of the pair of wiring patterns crosses a solid pattern.

24. A non-transitory computer-readable medium storing a program for operating a computer so as to function as a design support apparatus comprising:
an index indicator operating on a computer and configured to:
calculate, for each of a plurality of differential signal line pairs each constituted by a pair of wiring patterns, an index indicating a ratio of a section of a differential signal line pair, which section satisfies a design reference, to the entirety of the differential signal line pair, wherein in calculating the index for each of the plurality of differential signal line pairs, the index indicator divides each differential signal line pair into a plurality of sections at each position where a feature of the pair of wiring patterns of the differential signal line pair changes, and evaluates whether or not each of the plurality of sections satisfies the design reference,
control a display to display a first table showing the indices respectively calculated for the plurality of differential signal line pairs, with signal names thereof,
receive, from a designer via an input device, an instruction selecting, in the first table, a differential signal line pair among the plurality of differential signal line pairs,
control the display to display a second table showing results respectively evaluated for the plurality of sections of the selected differential signal line pair,
receive, from the designer via the input device, an instruction selecting, in the second table, a section among the plurality of sections of the selected differential signal line pair, and
control the display to display the circuit board in which the selected section is emphasized.

25. The non-transitory computer-readable medium according to claim 24, wherein the position includes:
a position where the pair of wiring patterns changes from a non-parallel state to a parallel state,
a position where the pair of wiring patterns changes from a parallel state to a non-parallel state,
a position of a via for each of the pair of wiring patterns,
a start or end position of an interval where the width of the pair of wiring patterns changes,
a start or end position of an interval where the interval between the pair of wiring patterns changes, and/or
a start or end position of a section where each of the pair of wiring patterns crosses a solid pattern.

* * * * *